US011537293B2

(12) United States Patent
Sun et al.

(10) Patent No.: US 11,537,293 B2
(45) Date of Patent: Dec. 27, 2022

(54) WEAR LEVELING METHODS FOR ZONED NAMESPACE SOLID STATE DRIVE

(71) Applicant: Western Digital Technologies, Inc., San Jose, CA (US)

(72) Inventors: Chao Sun, San Jose, CA (US); Xinde Hu, San Jose, CA (US); Dejan Vucinic, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/178,760

(22) Filed: Feb. 18, 2021

(65) Prior Publication Data
US 2022/0261160 A1 Aug. 18, 2022

(51) Int. Cl.
*G06F 3/06* (2006.01)
*H01L 25/065* (2006.01)
*H01L 25/18* (2006.01)

(52) U.S. Cl.
CPC .......... *G06F 3/0616* (2013.01); *G06F 3/0644* (2013.01); *G06F 3/0673* (2013.01); *H01L 25/0657* (2013.01); *H01L 25/18* (2013.01); *H01L 2225/06541* (2013.01)

(58) Field of Classification Search
CPC .... G06F 3/0616; G06F 3/0644; G06F 3/0673; H01L 25/0657; H01L 25/18; H01L 2225/06541
USPC ........................................................ 711/154
See application file for complete search history.

(56) References Cited

U.S. PATENT DOCUMENTS

| 8,954,689 | B2 | 2/2015 | Seekins et al. |
| 9,740,425 | B2 | 8/2017 | Bakshi et al. |
| 9,846,641 | B2 | 12/2017 | Franceschini et al. |
| 10,552,085 | B1 * | 2/2020 | Chen ..................... G06F 3/0647 |
| 2019/0102111 | A1 | 4/2019 | Shung |

(Continued)

FOREIGN PATENT DOCUMENTS

| CN | 111124305 A | 5/2020 |
| WO | WO-2007002866 A2 * | 1/2007 ........... G06F 3/0608 |

OTHER PUBLICATIONS

Zoned Namespaces, Cooperative Flash Management; Radian, Memory Systems; http://www.radianmemory.com/wp-content/uploads/2019/08/Radain_ZNS_Product_Overview_8-19_v1.pdf (7 pages).

(Continued)

*Primary Examiner* — Fernando Hidalgo
(74) *Attorney, Agent, or Firm* — Patterson & Sheridan, LLP; Steven H. VerSteeg

(57) ABSTRACT

A data storage device includes a memory device that includes a plurality of zones of a zoned namespace and a controller coupled to the memory device. During operation, the controller maintains a window-based read and write monitor data structure to determine the read density and write density of each of the zones. The read density and write density are utilized to determine a cost for allocating wear leveling data for each zone. Based on the cost and the available storage capacity of the storage class memory, data, in a data management operation, is moved to either the storage class memory or the zone with the low cost. The host device is informed of the storage class memory usage for future data management operations.

9 Claims, 9 Drawing Sheets

(56) References Cited

U.S. PATENT DOCUMENTS

2019/0108889 A1 4/2019 Gholamipour et al.
2019/0179570 A1 6/2019 Bahirat et al.

OTHER PUBLICATIONS

Onagi, Takahiro et al. "Design Guidelines of Storage Class Memory Based Solid-State Drives to Balance Performance, Power, Endurance and Cost", Japanese Journal of Applied Physics 54; iopscience.iop.org, Mar. 16, 2015 (8 pages).
Okamoto, Shun et al. "Application Driven SCM&NAND Flash Hybrid SSD Design for Data-Centric Computing Systems", IEEE, 2015 (4 pages).
Bjorling, Matias; "From Open-Channel SSD's to Zoned Namespaces", Western Digital, NSDI; Jan. 23, 2019 (18 pages).
Gonzalez, Javier; "Zoned Namespaces, Use Cases, Standard and Linux Ecosystem", SDC SNIA EMEA 20, Samsung (14 pages).

\* cited by examiner

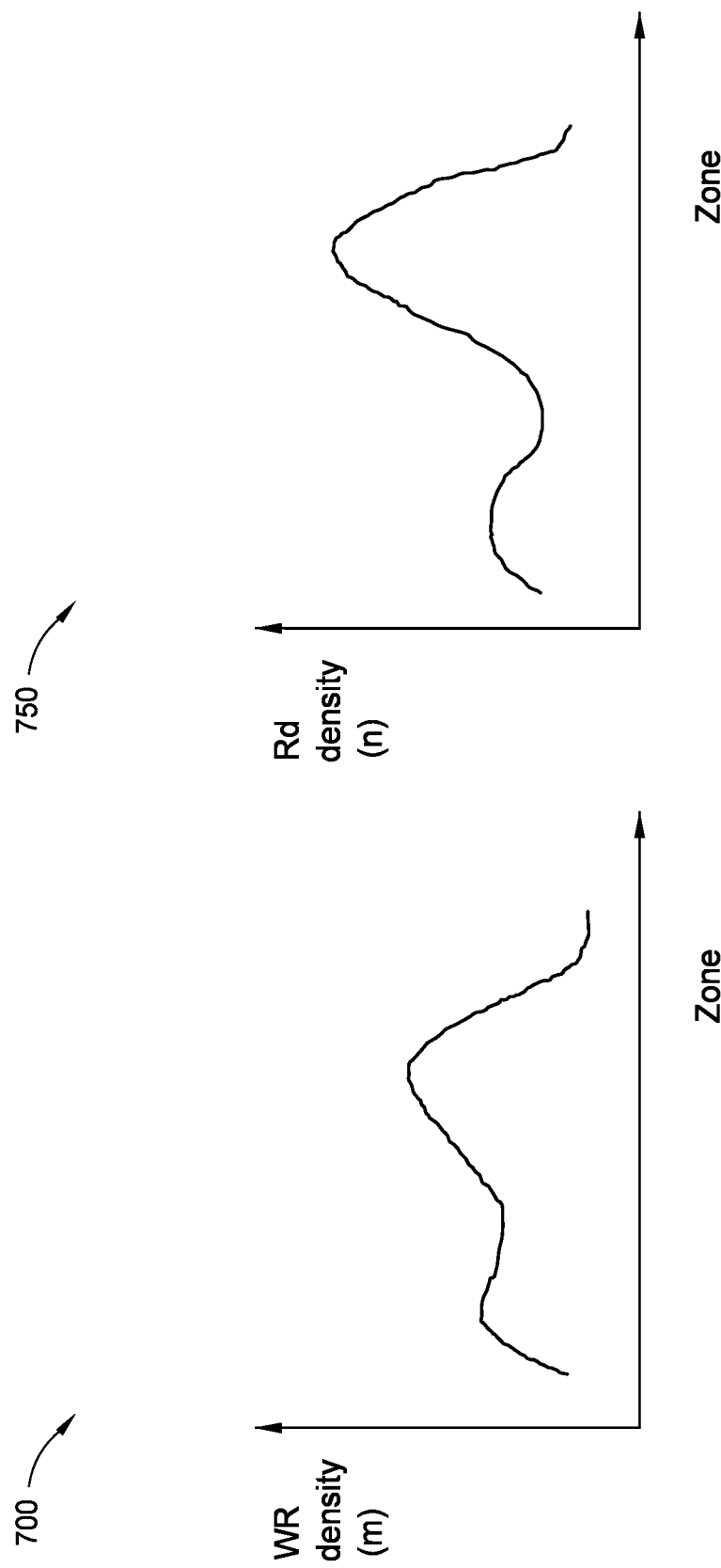

WEAR LEVELING METHODS FOR ZONED NAMESPACE SOLID STATE DRIVE

BACKGROUND OF THE DISCLOSURE

Field of the Disclosure

Embodiments of the present disclosure generally relate to data storage devices, such as a solid state drive (SSD), and data management operations.

Description of the Related Art

Storage devices, such as SSDs, may be used in computers in applications where relatively low latency and high capacity storage are desired. For example, SSDs may exhibit lower latency, particularly for random reads and writes, than hard disk drives (HDDs). Typically, a controller of the SSD receives a command to read or write data from a host device to a memory device. The data is read and written to one or more erase blocks in the memory device. Each logical block address is associated with a physical location on an erase block so that the SSD and/or the host device know the location of where the data is stored. In a zoned namespace (ZNS) architecture, one or more erase blocks may be grouped together by their respective logical block addresses to form a grouping or a zone. Data is typically written to each of the erase blocks in a grouping or a zone prior to writing data to erase blocks in a new grouping or a new zone.

ZNS SSDs may take advantage over other storage devices due to a deterministic input/output (I/O) latency and a low write amplification factor (WAF). Data management operations, such as garbage collection, may be due to controller scheduling algorithms in order to maintain a certain level of free blocks as well as wear leveling due to data retention, media reliability issues, and the like. The scheduling algorithms may be handled by the host device for ZNS architectures since the zones are host device managed. However, the controller may inform the host device when wear leveling is required.

For example, the host device determines that a zone requires garbage collection and instructs the SSD to begin a garbage collection operation. The host device may also instruct the SSD to move or copy the data associated with the garbage collection operation to a specific zone or zone. The data storage device may also initiate the garbage collection operation independently of the host device and determine the resulting location of the data during the garbage collection operation based on the wear leveling of the zones. Because host device initiated garbage collection operations may be initiated independently of the data storage device garbage collection operations, the deterministic I/O latency may be increased due to interference.

Thus, there is a need in the art for an improved wear leveling operation in order to maintain data storage device I/O determinism with little to no interference to normal zone operations with or without host device assistance.

SUMMARY OF THE DISCLOSURE

The present disclosure generally relates to data storage devices, such as SSDs and data management operations. A data storage device includes a memory device that includes a plurality of zones of a zoned namespace and a controller coupled to the memory device. During operation, the controller maintains a window-based read and write monitor data structure to determine the read density and write density of each of the zones. The read density and write density are utilized to determine a cost for allocating wear leveling data for each zone. Based on the cost and the available storage capacity of the storage class memory, data, in a data management operation, is moved to either the storage class memory or the zone with the low cost. The host device is informed of the storage class memory usage for future data management operations.

In one embodiment, a data storage device includes a memory device including a plurality of zones of a zoned namespace and a controller coupled to the memory device. The controller is configured to maintain a window-based read and write monitor data structure for each zone of the plurality of zones, determine a cost for allocating wear leveling data for each zone, and either move data to a wear leveling reserved memory or move data to a zone with a low cost.

In another embodiment, a data storage device includes a memory device and a controller coupled to the memory device. The controller is configured to scrub data from a zone of a plurality of zones in a zone namespace, determine whether block reallocation is required, determine whether the zone is reserved for wear leveling data, and determine whether a host device will manage wear leveling for the memory device.

In another embodiment, a data storage device includes memory means, wear leveling memory separate from the memory means, means to determine wear leveling for the memory means based on a cost function, and means to move data between the memory means and the wear leveling memory.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 7A and 7B are graphs illustrating the write/read I/O density of a zone, according to certain embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as SSDs and data management operations. A data storage device includes a memory device that includes a plurality of zones of a zoned namespace and a controller coupled to the memory device. During operation, the controller maintains a window-based read and write monitor data structure to determine the read density and write density of each of the zones. The read density and write density are utilized to determine a cost for allocating wear leveling data for each zone. Based on the cost and the available storage capacity of the storage class memory, data, in a data management operation, is moved to either the storage class memory or the zone with the low cost. The host device is informed of the storage class memory usage for future data management operations.

Figure 1:
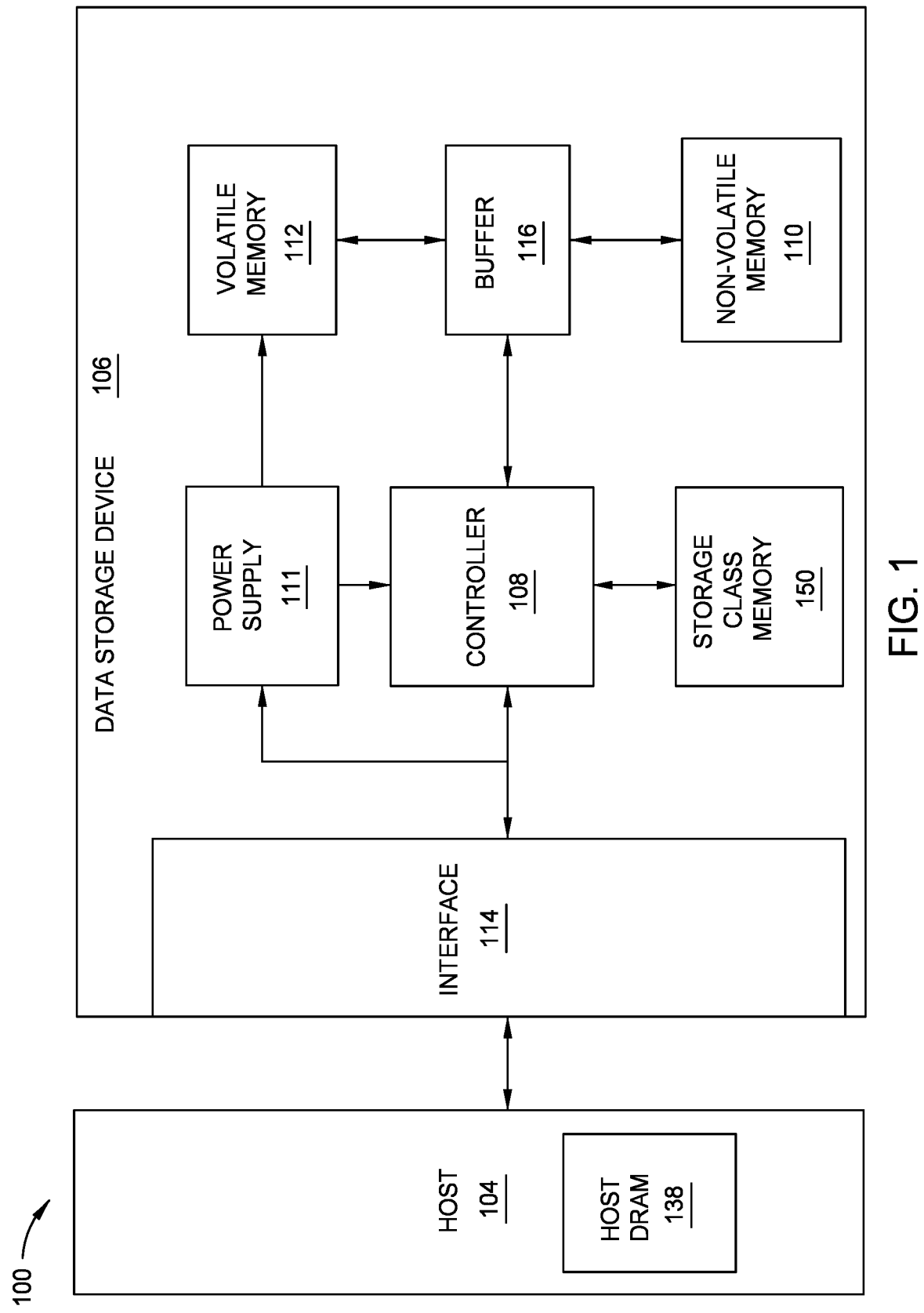
FIG. 1 is a schematic block diagram illustrating a storage system in which data storage device may function as a storage device for a host device, according to certain embodiments.

FIG. 1 is a schematic block diagram illustrating a storage system 100 in which data storage device 106 may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)). Traditionally, DRAM is used in SSD for logical to physical mapping, write buffering, and the like. However, in ZNS architecture, the DRAM size requirement may be reduced significantly since controller 108 only needs to manage at a coarse granularity of a zone rather than a logical page.

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The data storage device 106 further includes storage class memory (SCM) 150. In some embodiments, the SCM 150 is separate from the controller 108. In other embodiments, the SCM 150 is embedded in the controller 108. Furthermore, in some examples, the SCM 150 may be embedded in complementary metal oxide semiconductor (CMOS) under the array (CuA). The SCM 150 may be specifically utilized for wear leveling purposes for data storage operations, such as garbage collection, due to its fast access and non-volatility.

Figure 2:
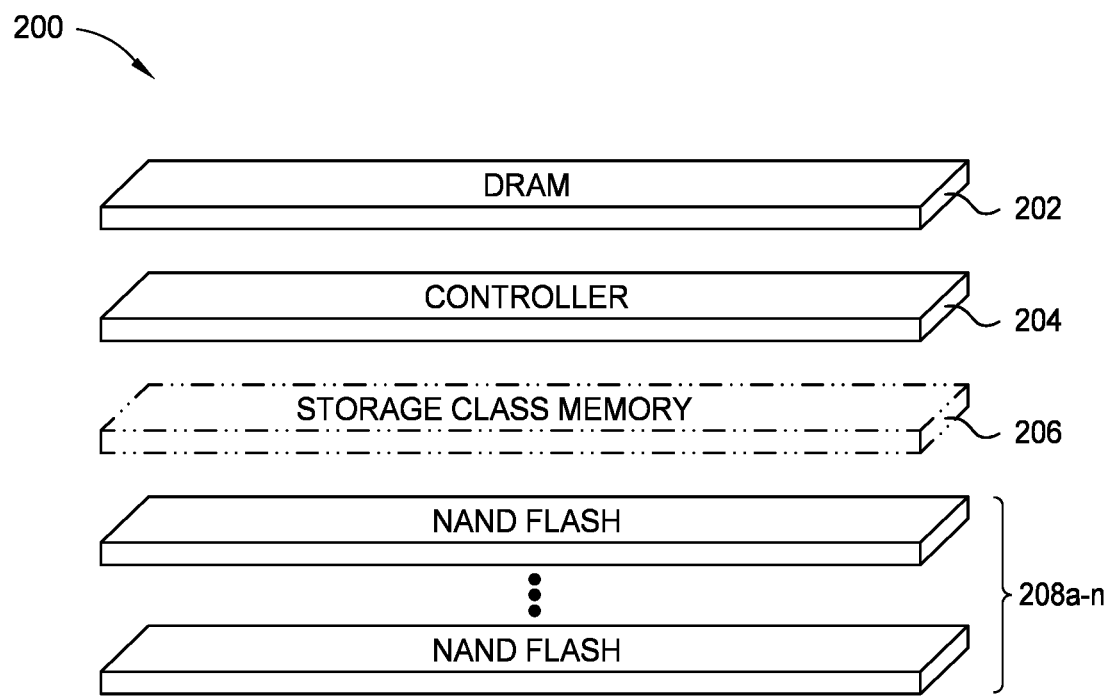
FIG. 2 is a schematic block diagram illustrating a three-dimensional (3D) expanded view of a through silicon via (TSV) stacking, according to certain embodiments.

FIG. 2 is a schematic block diagram illustrating a three-dimensional (3D) expanded view of a through silicon via (TSV) stacking 200, according to certain embodiments. Aspects of the data storage device 106 may be similar to the 3D TSV stacking 200. The 3D TSV stacking 200 includes a DRAM 202, a controller 204, a storage class memory (SCM) 206, and a plurality of NAND flashes 208a-n. The DRAM 202 may be the volatile memory 112, the controller 204 may be the controller 108, and the plurality of NAND flashes 208a-n may be the NVM 110. The SCM 206 is a non-volatile memory that the controller 204 may access quickly. In some examples, the SCM 206 is embedded in the controller 204. In other examples, the SCM 206 is coupled to the controller 204.

Figure 3:
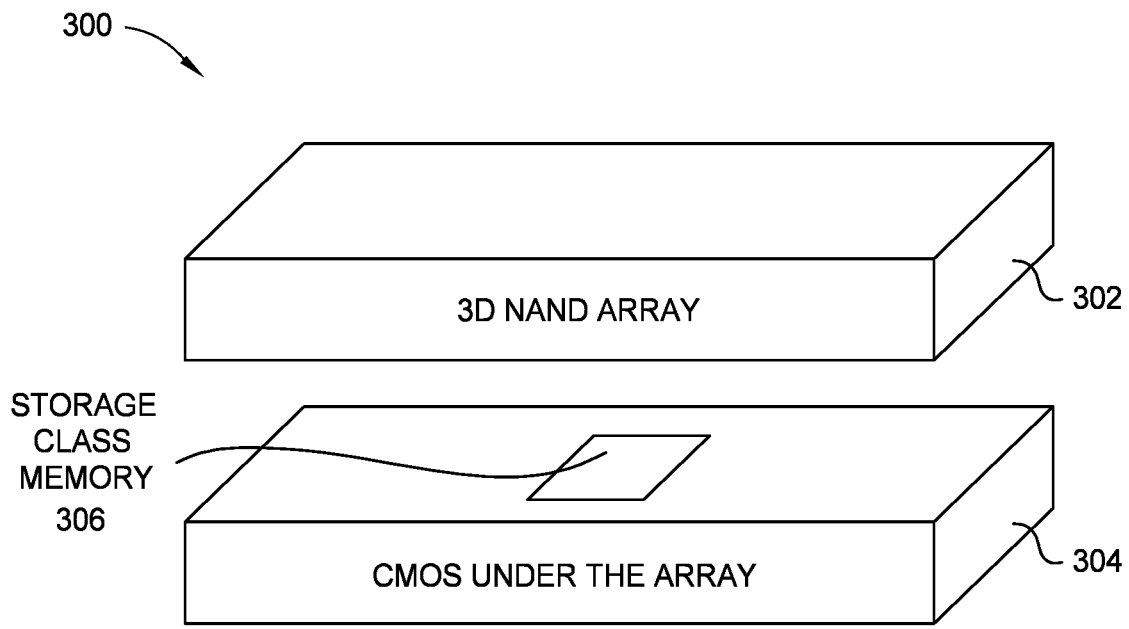
FIG. 3 is a schematic block diagram of an expanded view of a distributed storage class memory in a complementary metal oxide semiconductor (CMOS) under the array (CuA), according to certain embodiments.

FIG. 3 is a schematic block diagram of an expanded view of a distributed storage class memory in a complementary metal oxide semiconductor (CMOS) under the array (CuA) 300 arrangement, according to certain embodiments. The distributed SCM CuA 300 includes a 3D NAND array 302, which may be the NVM 110 of FIG. 1, and a CuA 304. CuA 304 may be used with the 3D NAND array 302 to improve the memory density and the I/O performance of the data storage device, such as the data storage device 106 of FIG. 1, by moving most of the peripheral circuits under the memory array. When additional area is available, the SCM 306 may be embedded in the CuA 304. In other examples, the SCM 306 may be coupled to the CuA 304.

Figure 4A:
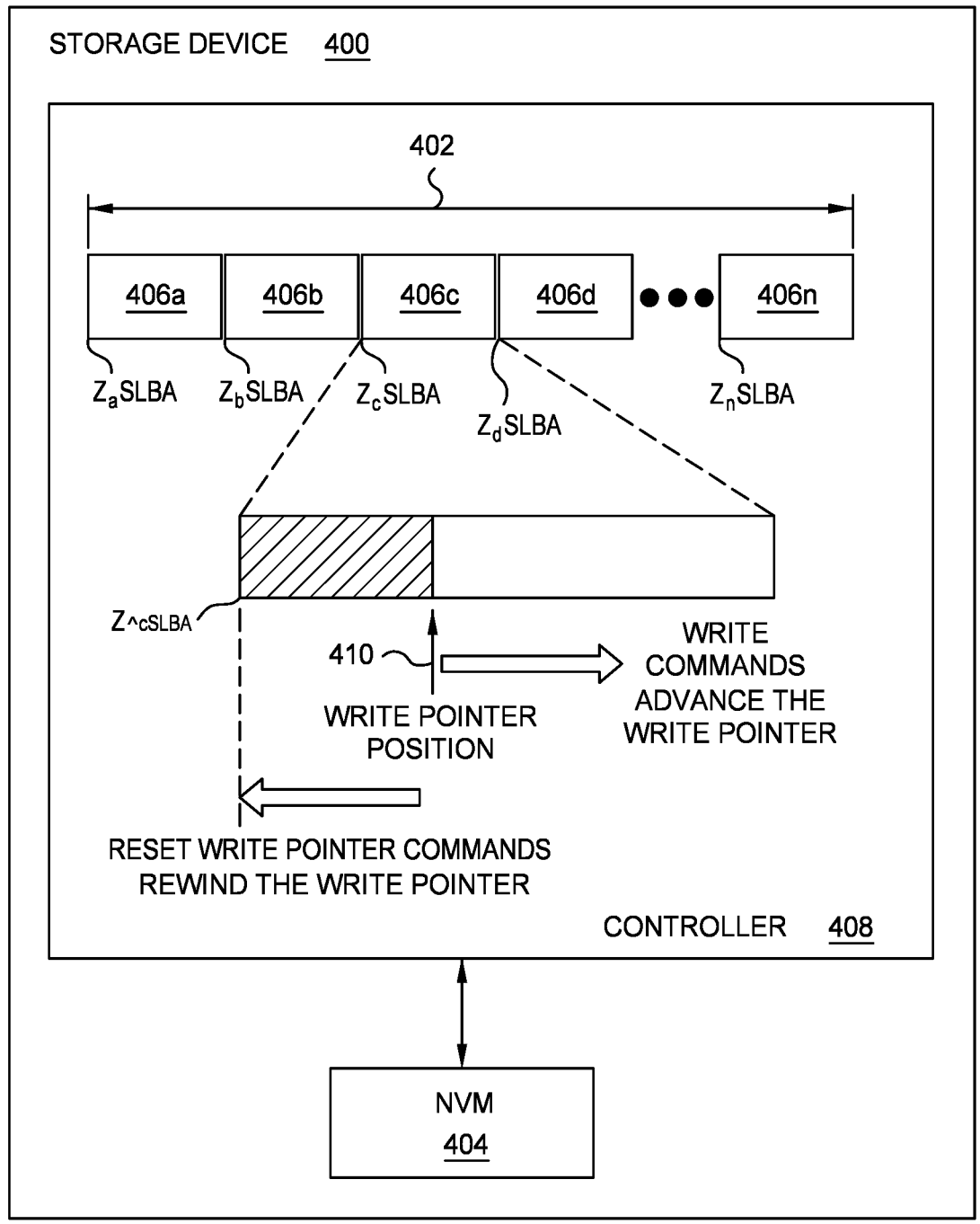
FIG. 4A illustrates a zoned namespace utilized in a storage device, according to certain embodiments.
Figure 4B:
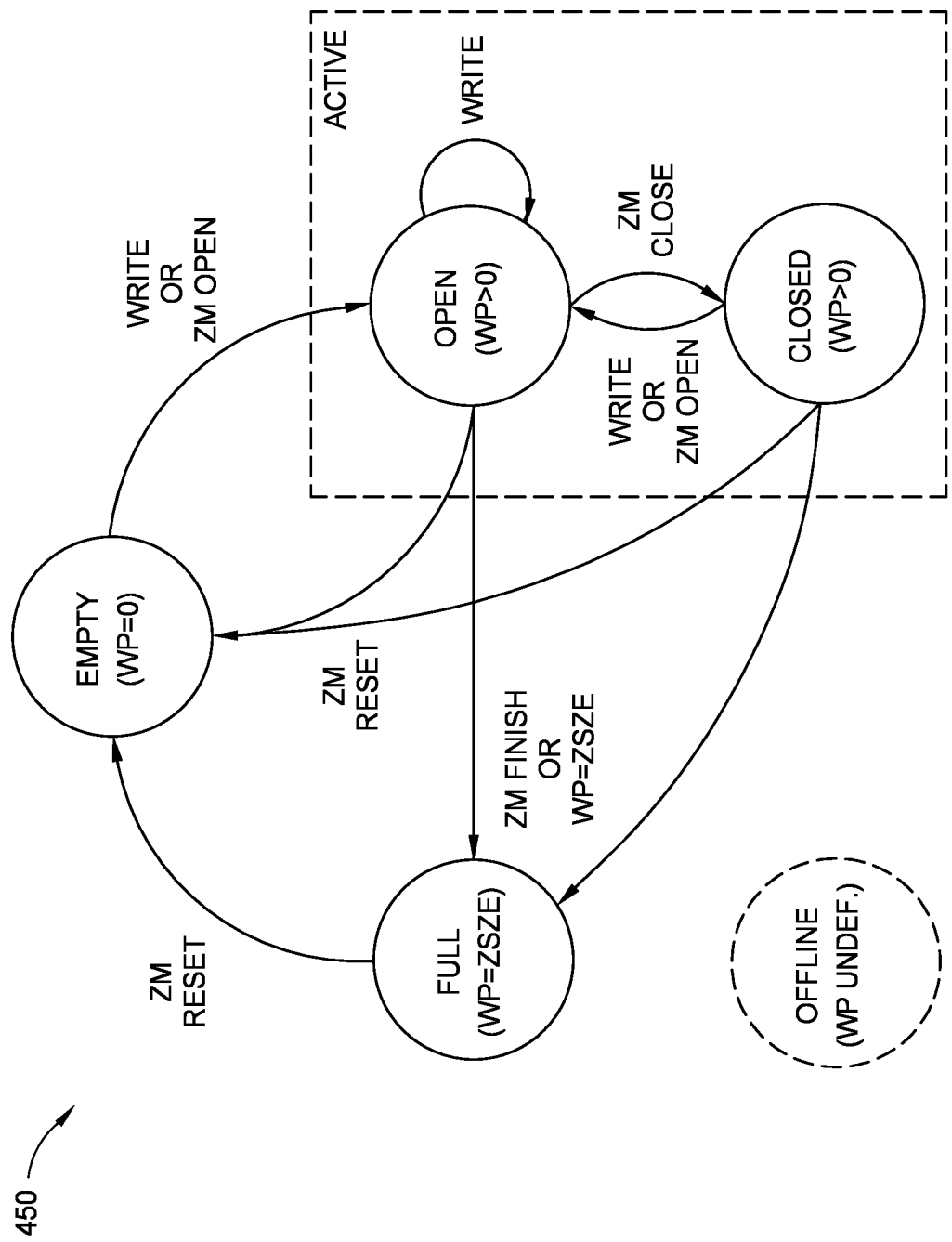
FIG. 4B illustrates a state diagram for the zoned namespaces of the storage device of FIG. 4A, according to certain embodiments.

FIG. 4A illustrates a Zoned Namespaces (ZNS) 402 view utilized in a storage device 400, according to one embodiment. The storage device 400 may present the ZNS 402 view to a host device. FIG. 4B illustrates a state diagram 450 for the ZNS 402 of the storage device 400, according to one embodiment. The storage device 400 may be the storage device 106 of the storage system 100 of FIG. 1. The storage device 400 may have one or more ZNS 402, and each ZNS 402 may be different sizes. The storage device 400 may further comprise one or more conventional namespaces in addition to the one or more Zoned Namespaces 402. Moreover, the ZNS 402 may be a zoned block command (ZBC) for SAS and/or a zoned-device ATA command set (ZAC) for SATA. Host side zone activity may be more directly related to media activity in zoned drives due to the relationship of logical to physical activity possible.

In the storage device 400, the ZNS 402 is the quantity of NVM that can be formatted into logical blocks such that the capacity is divided into a plurality of zones 406a-406n (collectively referred to as zones 406). The NVM may be the storage unit or NVM 110 of FIG. 1. Each of the zones 406 comprise a plurality of physical or erase blocks (not shown) of a memory unit or NVM 404, and each of the erase blocks are associated a plurality of logical blocks (not shown). Each of the zones 406 may have a size aligned to the capacity of one or more erase blocks of a NVM or NAND device. When the controller 408 receives a command, such as from a host device (not shown) or the submission queue of a host device, the controller 408 can read data from and write data to the plurality of logical blocks associated with the plurality of erase blocks (EBs) of the ZNS 402. Each of the logical blocks is associated with a unique LBA or sector.

In one embodiment, the NVM 404 is a NAND device. The NAND device comprises one or more dies. Each of the one or more dies comprises one or more planes. Each of the one or more planes comprises one or more erase blocks. Each of the one or more erase blocks comprises one or more wordlines (e.g., 256 wordlines). Each of the one or more wordlines may be addressed in one or more pages. For example, an MLC NAND die may use upper page and lower page to reach the two bits in each cell of the full wordline (e.g., 16 KiB per page). Furthermore, each page can be accessed at a granularity equal to or smaller than the full page. A controller can frequently access NAND in user data granularity logical block address (LBA) sizes of 512 bytes. Thus, as referred to in the below description, NAND locations are equal to a granularity of 512 bytes. As such, an LBA size of 512 bytes and a page size of 16 KiB for two pages of an MLC NAND results in 32 LBAs per wordline. However, the NAND location size is not intended to be limiting, and is merely used as an example.

When data is written to an erase block, one or more logical blocks are correspondingly updated within a zone 406 to track where the data is located within the NVM 404. Data may be written to one zone 406 at a time until a zone 406 is full, or to multiple zones 406 such that multiple zones 406 may be partially full. Similarly, when writing data to a particular zone 406, data may be written to the plurality of erase blocks one block at a time, in sequential order of NAND locations, page-by-page, or wordline-by-wordline, until moving to an adjacent block (i.e., write to a first erase block until the first erase block is full before moving to the second erase block), or to multiple blocks at once, in sequential order of NAND locations, page-by-page, or wordline-by-wordline, to partially fill each block in a parallel fashion (i.e., writing the first NAND location or page of each erase block before writing to the second NAND location or page of each erase block). This sequential programming of every NAND location is a typical non-limiting requirement of many NAND EBs.

When a controller 408 selects the erase blocks that will store the data for each zone, the controller 408 will be able to choose the erase blocks either at the zone open time, or it may choose the erase blocks as it reaches a need to fill the first wordline of that particular erase block. This may be more differentiating when the above described method of filling one erase block completely prior to starting the next erase block is utilized. The controller 408 may use the time difference to select a more optimal erase block in a just-in-time basis. The decision of which erase block is allocated and assigned for each zone and its contiguous LBAs can be occurring for zero or more concurrent zones at all times within the controller 408.

Each of the zones 406 is associated with a zone starting logical block address (ZSLBA) or zone starting sector. The ZSLBA is the first available LBA in the zone 406. For example, the first zone 406a is associated with $Z_a$SLBA, the second zone 406b is associated with $Z_b$SLBA, the third zone 406c is associated with $Z_c$SLBA, the fourth zone 406d is associated with $Z_d$SLBA, and the $n^{th}$ zone 406n (i.e., the last zone) is associated with $Z_n$SLBA. Each zone 406 is identified by its ZSLBA, and is configured to receive sequential writes (i.e., writing data to the NVM 110 in the order the write commands are received).

As data is written to a zone 406, a write pointer 410 is advanced or updated to point to or to indicate the next available block in the zone 406 to write data to in order to track the next write starting point (i.e., the completion point of the prior write equals the starting point of a subsequent write). Thus, the write pointer 410 indicates where the subsequent write to the zone 406 will begin. Subsequent write commands are 'zone append' commands, where the data associated with the subsequent write command appends to the zone 406 at the location the write pointer 410 is indicating as the next starting point. An ordered list of LBAs within the zone 406 may be stored for write ordering. Each zone 406 may have its own write pointer 410. Thus, when a write command is received, a zone is identified by its ZSLBA, and the write pointer 410 determines where the write of the data begins within the identified zone.

FIG. 4B illustrates a state diagram 450 for the ZNS 402 of FIG. 4A. In the state diagram 450, each zone may be in a different state, such as empty, active, full, or offline. When a zone is empty, the zone is free of data (i.e., none of the erase blocks in the zone are currently storing data) and the write pointer is at the ZSLBA (i.e., WP=0). An empty zone switches to an open and active zone once a write is scheduled to the zone or if the zone open command is issued by the host. Zone management (ZM) commands can be used to move a zone between zone open and zone closed states, which are both active states. If a zone is active, the zone comprises open blocks that may be written to, and the host may be provided a description of recommended time in the active state. The controller 408 comprises the ZM. Zone metadata may be stored in the ZM and/or the controller 408.

The term "written to" includes programming user data on greater than zero NAND locations in an erase block and/or partially filled NAND locations in an erase block when user data has not filled all of the available NAND locations. The term "written to" may further include moving a zone to full due to internal drive handling needs (open block data retention concerns because the bits in error accumulate more quickly on open erase blocks), the storage device 400 closing or filling a zone due to resource constraints, like too many open zones to track or discovered defect state, among others, or a host device closing the zone for concerns such as there being no more data to send the drive, computer shutdown, error handling on the host, limited host resources for tracking, among others.

The active zones may be either open or closed. An open zone is an empty or partially full zone that is ready to be written to and has resources currently allocated. The data received from the host device with a write command or zone append command may be programmed to an open erase block that is not currently filled with prior data. A closed zone is an empty or partially full zone that is not currently receiving writes from the host in an ongoing basis. The movement of a zone from an open state to a closed state allows the controller 308 to reallocate resources to other tasks. These tasks may include, but are not limited to, other zones that are open, other conventional non-zone regions, or other controller needs.

In both the open and closed zones, the write pointer is pointing to a place in the zone somewhere between the ZSLBA and the end of the last LBA of the zone (i.e., WP>0). Active zones may switch between the open and closed states per designation by the ZM, or if a write is scheduled to the zone. Additionally, the ZM may reset an active zone to clear or erase the data stored in the zone such that the zone switches back to an empty zone. Once an active zone is full, the zone switches to the full state. A full zone is one that is completely filled with data, and has no more available sectors or LBAs to write data to (i.e., WP=zone capacity (ZCAP)). In a full zone, the write pointer points to the end of the writeable capacity of the zone. Read commands of data stored in full zones may still be executed.

The zones may have any total capacity, such as 256 MiB or 512 MiB. However, a small portion of each zone may be inaccessible to write data to, but may still be read, such as a portion of each zone storing the parity data and one or more excluded erase blocks. For example, if the total capacity of a zone 406 is 512 MiB, the ZCAP may be 470 MiB, which is the capacity available to write data to, while 42 MiB are unavailable to write data. The writeable capacity (ZCAP) of a zone is equal to or less than the total zone storage capacity. The storage device 400 may determine the ZCAP of each zone upon zone reset. For example, the controller 408 or the ZM may determine the ZCAP of each zone. The storage device 400 may determine the ZCAP of a zone when the zone is reset.

The ZM may reset a full zone, scheduling an erasure of the data stored in the zone such that the zone switches back to an empty zone. When a full zone is reset, the zone may not be immediately cleared of data, though the zone may be marked as an empty zone ready to be written to. However, the reset zone must be erased prior to switching to an open and active zone. A zone may be erased any time between a ZM reset and a ZM open. Upon resetting a zone, the storage device 400 may determine a new ZCAP of the reset zone and update the Writeable ZCAP attribute in the zone metadata. An offline zone is a zone that is unavailable to write data to. An offline zone may be in the full state, the empty state, or in a partially full state without being active.

Since resetting a zone clears or schedules an erasure of all data stored in the zone, the need for garbage collection of individual erase blocks is eliminated, improving the overall garbage collection process of the storage device 400. The storage device 400 may mark one or more erase blocks for erasure. When a new zone is going to be formed and the storage device 400 anticipates a ZM open, the one or more erase blocks marked for erasure may then be erased. The storage device 400 may further decide and create the physical backing of the zone upon erase of the erase blocks. Thus, once the new zone is opened and erase blocks are being selected to form the zone, the erase blocks will have been erased. Moreover, each time a zone is reset, a new order for the LBAs and the write pointer 410 for the zone 406 may be selected, enabling the zone 406 to be tolerant to receive commands out of sequential order. The write pointer 410 may optionally be turned off such that a command may be written to whatever starting LBA is indicated for the command.

Referring back to FIG. 4A, when the host sends a write command to write data to a zone 406, the controller 408 pulls-in the write command and identifies the write command as a write to a newly opened zone 406. The controller 408 selects a set of EBs to store the data associated with the write commands of the newly opened zone 406 to, and the newly opened zone 406 switches to an active zone 406. The write command may be a command to write new data, or a command to move valid data to another zone for garbage collection purposes. The controller 408 is configured to DMA read new commands from a submission queue populated by a host device.

In an empty zone 406 just switched to an active zone 406, the data is assigned to the zone 406 and the associated set of sequential LBAs of the zone 406 starting at the ZSLBA, as the write pointer 410 is indicating the logical block associated with the ZSLBA as the first available logical block. The data may be written to one or more erase blocks or NAND locations that have been allocated for the physical location of the zone 406. After the data associated with the write command has been written to the zone 406, a write pointer 410 is updated to point to the next LBA available for a host write (i.e., the completion point of the first write). The write data from this host write command is programmed sequentially into the next available NAND location in the erase block selected for physical backing of the zone.

For example, the controller 408 may receive a first write command to a third zone 406c, or a first zone append command. The host identifies sequentially which logical block of the zone 406 to write the data associated with the first command to. The data associated with the first command is then written to the first or next available LBA(s) in the third zone 406c as indicated by the write pointer 410, and the write pointer 410 is advanced or updated to point to the next available LBA available for a host write (i.e., WP>0). If the controller 408 receives a second write command to the third zone 406c, or a second zone append command, the data associated with the second write command is written to the next available LBA(s) in the third zone 406c identified by the write pointer 410. Once the data associated with the second command is written to the third zone 406c, the write pointer 410 once again advances or updates to point to the next available LBA available for a host write. Resetting the third zone 406c moves the write pointer 410 back to the $Z_c$SLBA (i.e., WP=0), and the third zone 406c switches to an empty zone.

Figure 5:
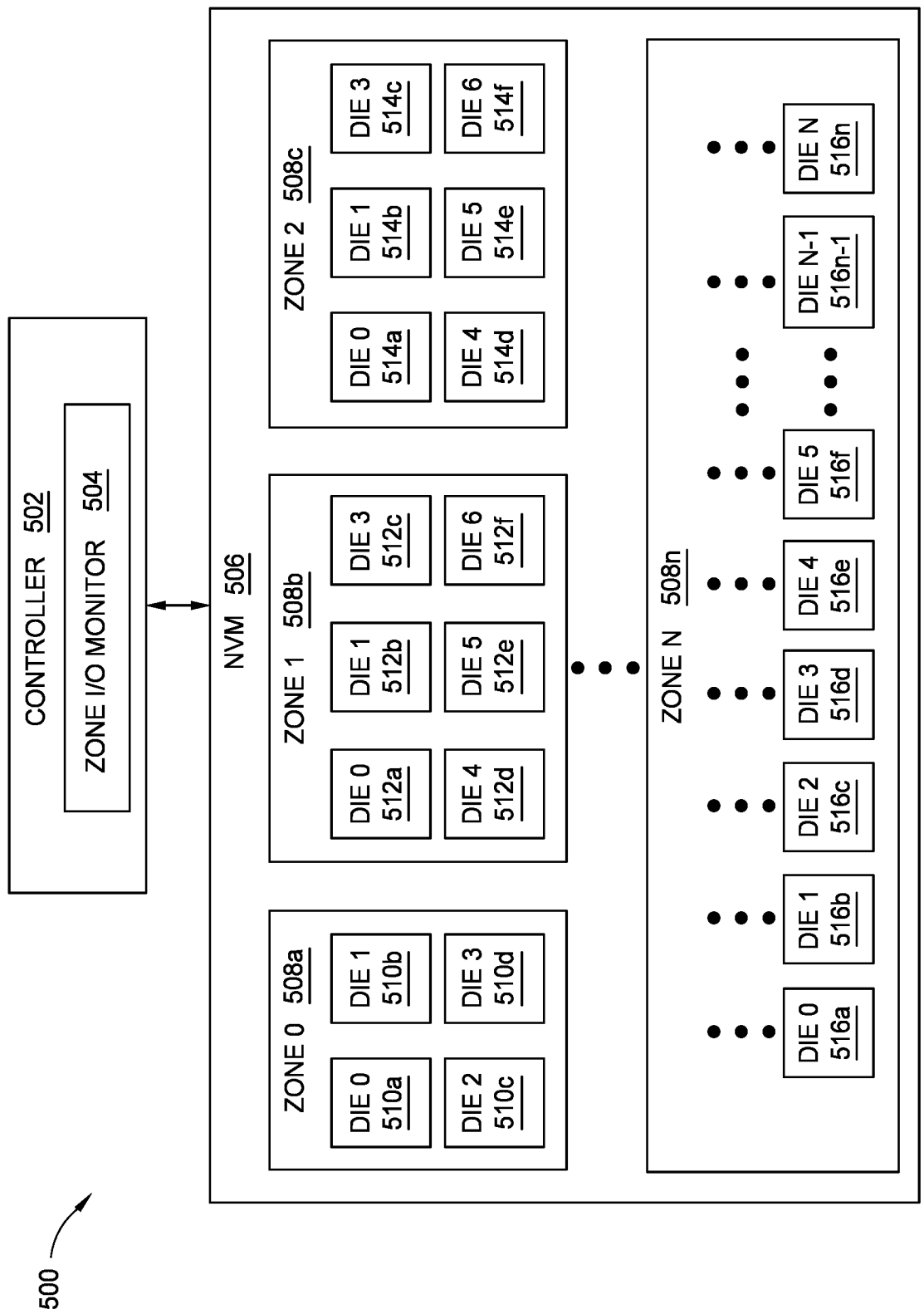
FIG. 5 is a schematic block diagram illustrating monitoring one or more zones input/output density, according to certain embodiments.

FIG. 5 is a schematic block diagram 500 illustrating of a monitoring one or more zones input/output density, according to certain embodiments. The controller 502 may be the controller 108 of FIG. 1. Furthermore, the NVM 506 may be the NVM 110 of FIG. 1. The controller 502 includes a zone I/O monitor 504 configured to monitor the reads and writes to each zone of the NVM 506. The zone I/O monitor 504 may maintain a window based read and write monitor data structure for each data structure of the NVM 506. In some examples, the data structure is a zone. In other examples, the data structure is an arrangement of dies or blocks. The controller 502 may utilize the read and write data to develop a cost for allocating wear leveling data, such as the data being relocated during a garbage collection operation, to a certain zone.

The NVM 506 includes a plurality zones 508a-n. Each zone of the plurality zones 508a-n includes one or more dies.

For example, a first zone 0 508*a* includes four dies 510*a*-510*d*, a second zone 1 508*b* includes six dies 512*a-f*, a third zone 2 508*c* includes six dies 514*a-f*, and an Nth zone N 508*n* includes a plurality of dies 516*a-n*. In some examples, each zone of the NVM 506 includes the same number of dies. In other examples, each zone of the NVM 506 is non-uniform in the number of dies. Furthermore, each zone may be located across through multiple different channels of the NVM 506, within the same channel of the NVM 506, or a mixture of the previously described locations.

Figure 6:
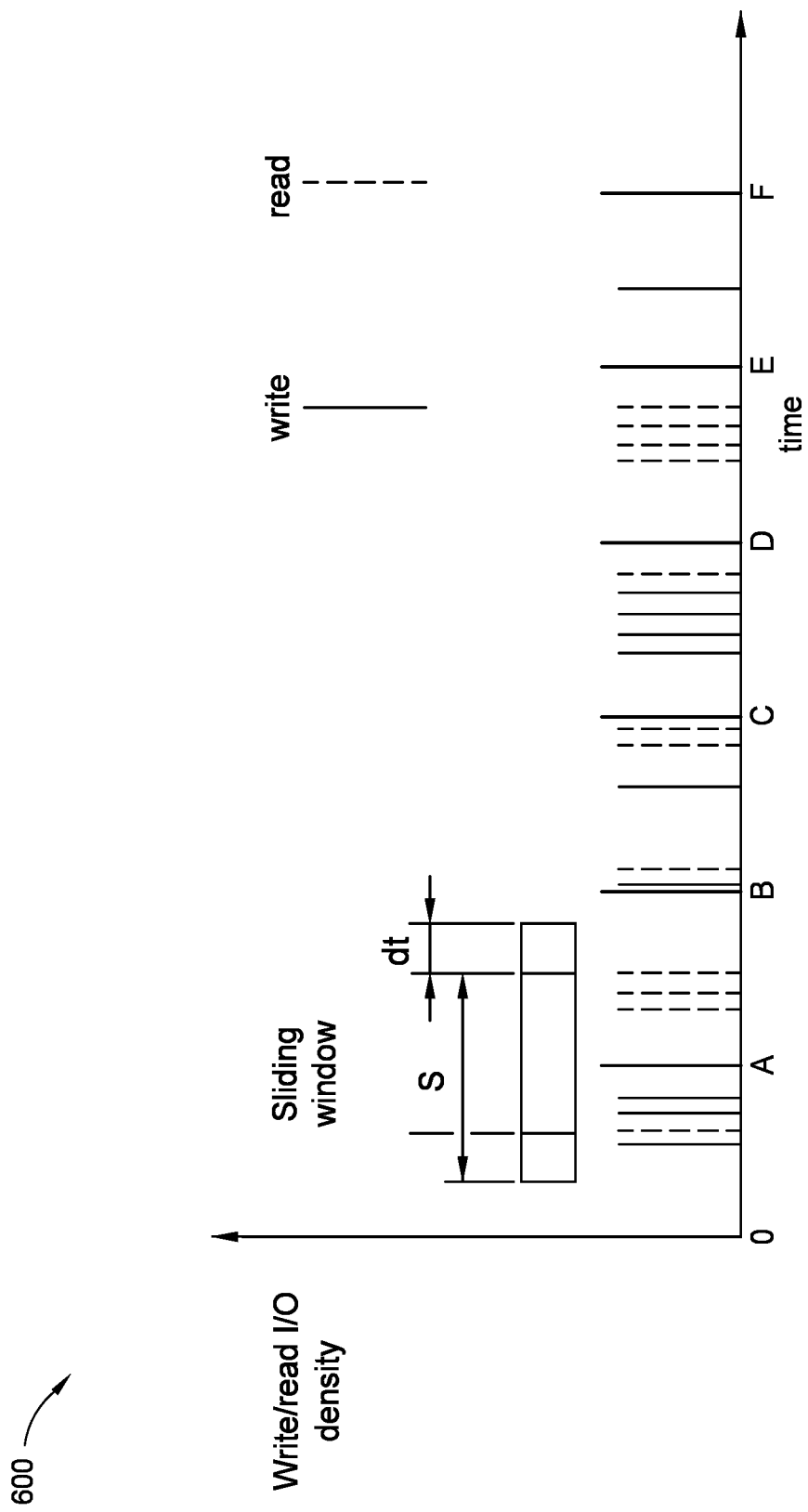
FIG. 6 is a graph illustrating determining the write/read I/O density, according to certain embodiments.

FIG. 6 is a graph 600 illustrating determining the write/read I/O density, according to certain embodiments. The graph 600 illustrates reads and writes to a zone, such as the first zone 0 508*a* of FIG. 5, according to one example. The zone I/O monitor, such as the zone I/O monitor 504 of FIG. 5, monitors the read and writes of each zone utilizing a sliding window. The sliding window is an adjustable parameter for calculating the read density or the write density, where the adjustable parameter may be based on the health of the device, the bit error rate (BER) of the dies of the zone, the current bandwidth, and the like.

For example, the sliding window may have a size of time 0 to time A, where the right boundary, the boundary at time A in the current example, reflects the current time. Based on the sliding window, the read density is ⅓ and the write density is ⅔. As time advances, the read density and the write density may change due to additional reads and additional writes. For the first zone 0 508*a*, the zone I/O monitor 504 may record stats such as: zone 0 (wr: x0, rd: y0).

In another embodiment, in the case that the I/O density is low due to workload temporal characteristics or other parameters, the I/O window may be fixed. The reads and writes may be accumulated for a period of time to determine the density of reads and writes. The I/O window may be implemented as a ring-like buffer structure, where a first buffer structure is utilized for reads and a second buffer structure is utilized for writes. The size of the buffer structure is the size of the I/O window. For the first zone 0 508*a* and the second zone 1 508*b*, the zone I/O monitor 504 may record stats such as: zone 0 (ts_wr0, te_wr0, ts_rd0, te_rd0), zone 1 (ts_wr1, te_wr1, ts_rd1, te_rd1), which may be retrieved form the buffer structure. In some examples, the I/O window may be updated every time a time-period elapses.

FIGS. 7A and 7B are graphs illustrating the write/read I/O density of a zone, according to certain embodiments. The read density graph 700 and the write density graph 750 each illustrates the number of reads or writes, respectively, based on the total number of reads and writes for a zone. Because the read density and the write density are neither uniform nor the same, the cost of allocating wear leveling data to a zone may be influenced by the read density and the write density separately. For example, a cost function may be either $f=w1*m+w2*n+p$, $f=p*(w1*m+w2*n)$, or $f=w1*n+p$, where f is the cost function, w1 is a weight for reads, w2 is weight for writes, n is the read density, m is the write density, and p is a penalty related to wear leveling. The penalty may be a variable value based on how many pages are to be copied. In the example of cost function, $f=w1*n+p$, only the read quality of service (QoS) impact is considered. It is to be understood that other cost functions are contemplated and are applicable to the embodiments described.

Figure 8A:
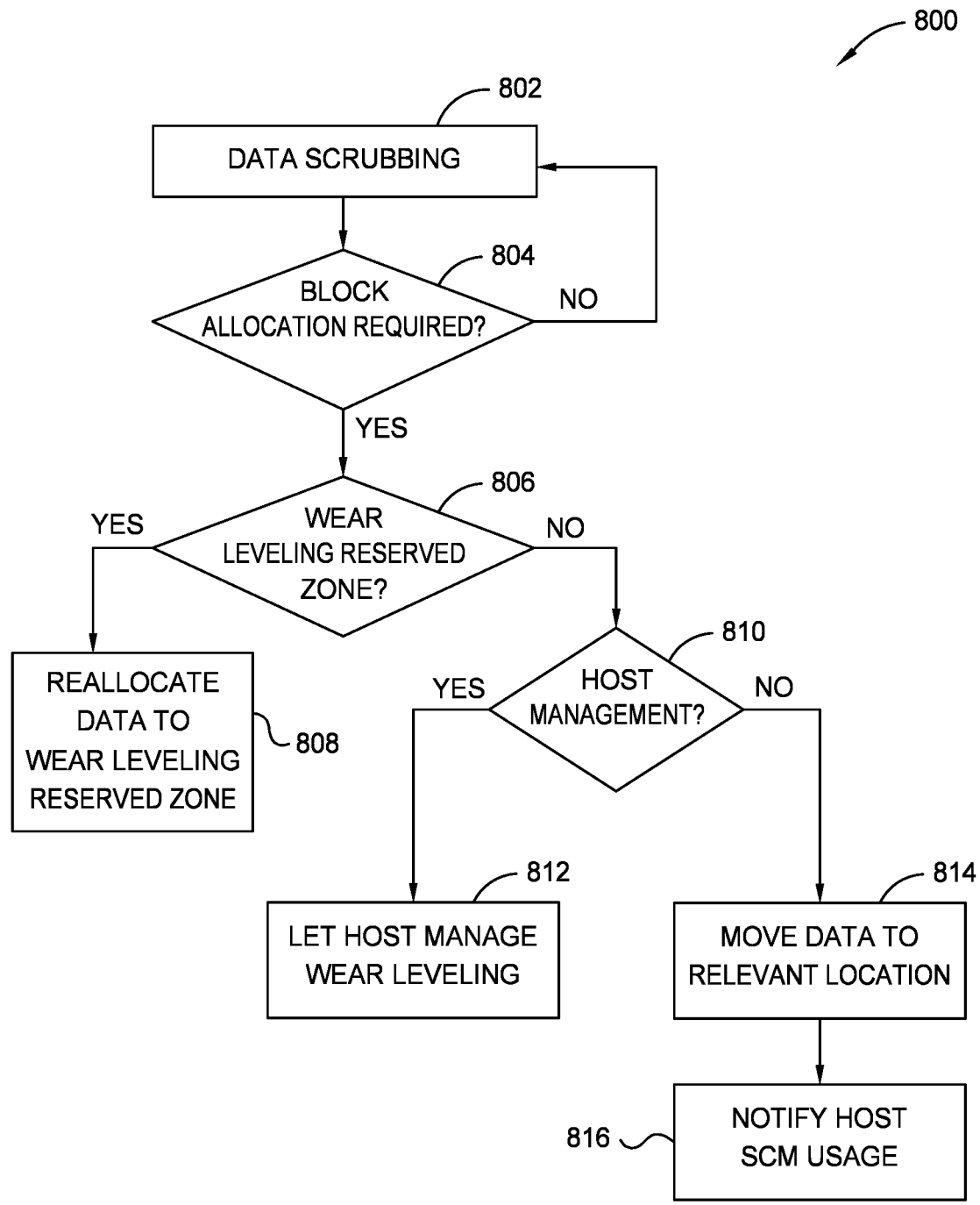
FIG. 8A is a flowchart illustrating a method of a data management operation, according to certain embodiments.

FIG. 8A is a flowchart illustrating a method 800 of a data management operation, according to certain embodiments. At block 802, a data scrubbing or data management operation, such as garbage collection begins. At block 804, the controller, such as the controller 502 of FIG. 5, determines whether block allocation is required for the operation at block 802. If no block allocation is required at block 804, then the method 800 returns to block 802. However if block allocation is required at block 804, then the controller 502 determines if the block allocation location is to a wear leveling reserved zone at block 806. The wear leveling reserved zone may be a zone that is used for the data scrubbing operations or data management operations, such as first zone 0 508*a* of FIG. 5.

If there is a wear leveling reserved zone at block 806, then the data is reallocated to the wear leveling reserved zone at block 808. However, if there is not a wear leveling reserved zone at block 806, then at block 810, the controller determines if the host device, such as the host device 104 of FIG. 1, manages the placement of the wear leveling data at block 812. However, if the host device does not manage the placement of the wear leveling data at block 810, then the controller 502 moves the data to a relevant location at block 814. The relevant location may either be a wear leveling reserved memory or a zone with the lowest cost. The wear leveling reserved memory may either be static random access memory (SRAM), dynamic random access memory (DRAM), storage class memory (SCM), phase change memory (PCM), or magnetic random access memory (MRAM). Other memories are contemplated and may be applicable to the embodiments described. In the description below, SCM is referred to for exemplary purposes and the described embodiments may be applicable to the abovementioned examples. In some examples, the controller 502 may place the data in a zone with a low cost that is most optimal. For example, if the zone with the lowest cost has I/O operations occurring, then the next lowest cost zone may be utilized for the data scrubbing operation or the data management operation. In another example, the data associated with the data management operation may be relocated to the volatile memory, such as the volatile memory 112 of FIG. 1, or an internal buffer, such as the buffer 116 of FIG. 1. For example, the relevant location may be the buffer 116. At block 816, the host device 104 is notified of the SCM 150 usage.

Figure 8B:
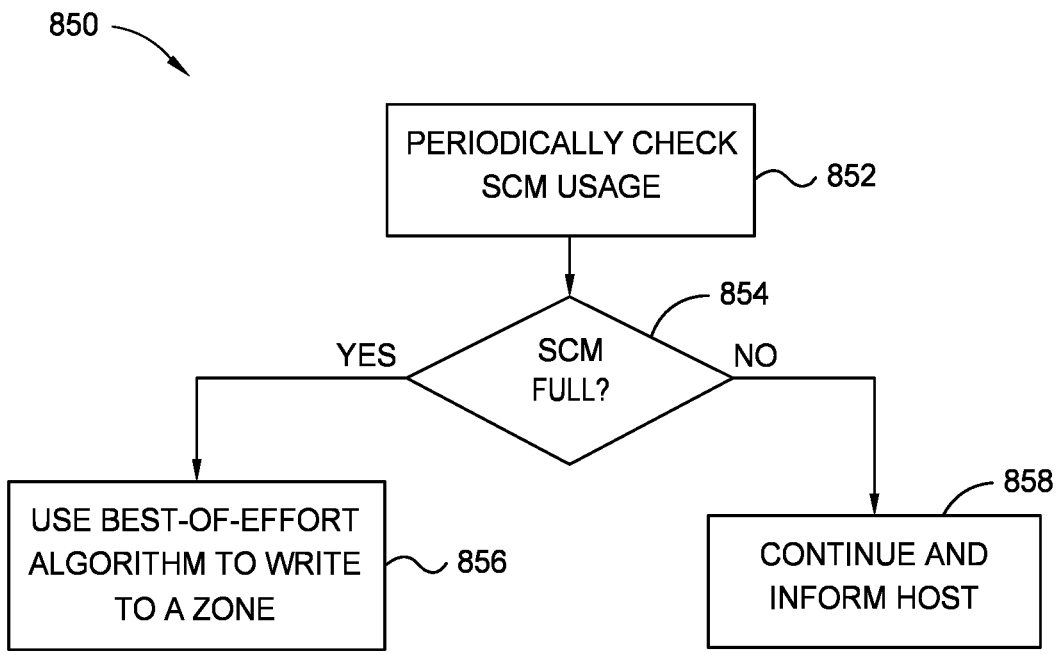
FIG. 8B is a flowchart illustrating a method of determining a location of where data associated with a data management operation is written to during the data management operation, according to certain embodiments.

FIG. 8B is a flowchart illustrating a method 850 of determining a location of where data associated with a data management operation is written to during the data management operation, according to certain embodiments. The method 850 may occur concurrently with the method 800 or after certain steps, such as between block 810 and block 814 or block 814 and block 816. It is to be understood that the listed steps are intended to be examples of possible locations of the method 850 occurring and are not intended to be limiting.

At block 852, the controller 502 periodically checks the SCM 150 usage. The usage of the SCM 150 may be a function of the SCM 150 latency, the SCM 150 bandwidth, the available capacity of the SCM 150, and the like. At block 854, the controller 502 determines if the SCM 150 is full. If the SCM 150 is full, then at block 856, the controller 502 utilizes a best-of-effort algorithm to determine a cost for each zone, where the write is to a low cost zone. The best-of-effort algorithm may incorporate the embodiments described in FIGS. 5, 6, 7A, and 7B. However, if the SCM 150 is not full, then the host device 104 is notified at block 858 and the data is moved to the SCM 150.

Figure 9:
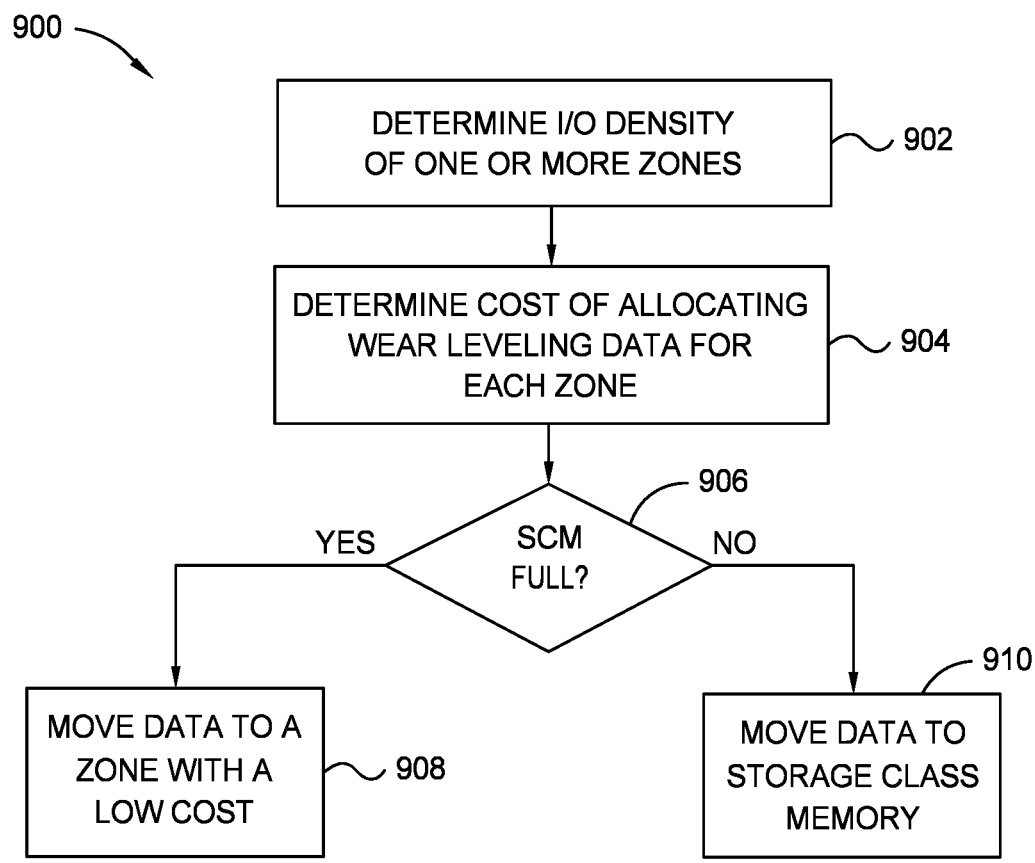
FIG. 9 is a flowchart illustrating a method of a data management operation with respect to wear leveling, according to certain embodiments.

FIG. 9 is a flowchart illustrating a method 900 of a data management operation with respect to wear leveling, according to certain embodiments. Aspects of FIG. 5 may be utilized in the description of the method 900. At block 902, the controller, such as the controller 502, utilizes the zone I/O monitor, such as the zone I/O monitor 504, to determine the I/O density of one or more zones of the NVM 506. At block 904, the controller or the zone I/O monitor 504 determines the cost of allocating wear leveling data for each of the zones monitored. At block 906, the controller determines if the SCM, such as the SCM 150 of FIG. 1, is full. If the SCM 150 is full, then at block 908, the controller moves the wear leveling data to a zone with a low cost or the lowest cost based on the determining at block 904. However, if the SCM 150 is not full at block 906, then the wear leveling data is moved to the SCM 150 at block 910.

By determining where data associated with data management operations, such as garbage collection, should be reallocated intuitively, there will be less resource contention. As a result, the performance of the data storage device may increase.

In one embodiment, a data storage device includes a memory device including a plurality of zones of a zoned namespace and a controller coupled to the memory device. The controller is configured to maintain a window-based read and write monitor data structure for each zone of the plurality of zones, determine a cost for allocating wear leveling data for each zone, and either move data to a wear leveling reserved memory or move data to a zone with a low cost.

The wear leveling reserved memory is distinct from the memory device. The wear leveling reserved memory is either volatile memory or non-volatile memory. The volatile memory is either static random access memory (SRAM) or dynamic random access memory (DRAM). The non-volatile memory is either storage class memory (SCM), phase change memory (PCM), or magnetic random access memory (MRAM). The data storage device further includes a 3D through silicon via stack. The stack includes the memory device, storage class memory disposed over the memory device, the controller disposed over the memory device, and a volatile memory device disposed over the controller. The storage class memory is integrated into the controller. The data storage device further includes a CMOS under the array with storage class memory distributed therein. The memory device is a 3D memory device disposed over the CMOS under the array. The controller is further configured to move data between storage class memory and the memory device for wear leveling. The controller is configured to determine whether the storage class memory is full and empty the storage class memory to the zone with the low cost.

In another embodiment, a data storage device includes a memory device and a controller coupled to the memory device. The controller is configured to scrub data from a zone of a plurality of zones in a zone namespace, determine whether block reallocation is required, determine whether the zone is reserved for wear leveling data, and determine whether a host device will manage wear leveling for the memory device.

When the zone is reserved for wear leveling data, the controller is configured to reallocate data to the zone reserved for wear leveling data. When controller determines that the host device will manage wear leveling for the memory device, the controller permits the host device to manage the zone. When the controller determines that the host device will not manage wear leveling for the memory device, the controller moves data to storage class memory. The controller is configured to notify the host device of a usage of the storage class memory. The controller is configured to periodically check storage class memory usage and determine whether the storage class memory is full. The controller is configured to continually inform a host device of the storage class memory usage. When the controller determines the storage class memory is full, the controller is configured to use a best of effort algorithm to write data to a zone and empty the storage class memory. The controller is configured to track data input and output to the plurality of zones develop a cost function for determining a cost of allocating wear leveling data for the plurality of zones, and select a zone with a lowest cost.

In another embodiment, a data storage device includes memory means, wear leveling memory separate from the memory means, means to determine wear leveling for the memory means based on a cost function, and means to move data between the memory means and the wear leveling memory.

The cost function includes a sum of a weighted read measurement, a wear leveling penalty, and a weighted write measurement. The volatile memory includes a plurality of areas, wherein an area of the plurality of areas is either static random access memory (SRAM), dynamic random access memory (DRAM), storage class memory (SCM), phase change memory (PCM), or magnetic random access memory (MRAM).

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
track a read density and/or a write density of each zone of a plurality of zones in a zone namespace using a sliding window;
initiate a data scrubbing operation to scrub data from a zone of the plurality of zones;
in response to initiating the data scrubbing operation, determine whether block reallocation is required;
in response to determining that block reallocation is required, determine whether a different zone of the plurality zones other than the zone is reserved for wear leveling data;
in response to determining that the different zone is not reserved for wear leveling data, determine whether a host device will manage wear leveling for the memory device; and
relocate the data to, when the host device will not manage the wear leveling for the memory device, either:
the different zone; or
another zone of the plurality of zones, wherein the another zone is distinct from the zone and the different zone, and wherein relocating is based on determining whether the different zone or the another zone has a lowest cost based on the tracked read density and/or the tracked write density.

2. The data storage device of claim 1, wherein when the different zone is reserved for the wear leveling data, the controller is configured to reallocate data to the different zone reserved for the wear leveling data.

3. The data storage device of claim 1, wherein when the controller determines that the host device will manage wear leveling for the memory device, the controller permits the host device to manage the zone.

4. A data storage device, comprising:
a memory device; and
a controller coupled to the memory device, wherein the controller is configured to:
scrub data from a zone of a plurality of zones in a zone namespace;
determine whether block reallocation is required;
determine whether the zone is reserved for wear leveling data; and
determine whether a host device will manage wear leveling for the memory device, wherein when the controller determines that the host device will not manage wear leveling for the memory device, the controller moves data to storage class memory.

5. The data storage device of claim 4, wherein the controller is configured to notify the host device of a usage of the storage class memory.

6. The data storage device of claim 1, wherein the controller is configured to periodically check storage class memory usage and determine whether the storage class memory is full.

7. The data storage device of claim 6, wherein the controller is configured to continually inform a host device of the storage class memory usage.

8. A data storage device, comprising:
a memory device; and
a controller coupled to the memory device, wherein the controller is configured to:
scrub data from a zone of a plurality of zones in a zone namespace;
determine whether block reallocation is required;
determine whether the zone is reserved for wear leveling data;
determine whether a host device will manage wear leveling for the memory device; and
periodically check storage class memory usage and determine whether the storage class memory is full, wherein when the controller determines the storage class memory is full, the controller is configured to use a best of effort algorithm to write data to a zone and empty the storage class memory.

9. A data storage device, comprising:
a memory device; and
a controller coupled to the memory device, wherein the controller is configured to:
scrub data from a zone of a plurality of zones in a zone namespace;
determine whether block reallocation is required;
determine whether the zone is reserved for wear leveling data;
determine whether a host device will manage wear leveling for the memory device;
track data input and output to the plurality of zones;
develop a cost function for determining a cost of allocating wear leveling data for the plurality of zones; and
select a zone with a lowest cost.

* * * * *